(12) United States Patent
Burroughs et al.

(10) Patent No.: US 6,977,123 B1
(45) Date of Patent: Dec. 20, 2005

(54) BATTERY WITH STRENGTH INDICATOR

(75) Inventors: James R. Burroughs, Encino, CA (US); Alan N. O'Kain, Corona del Mar, CA (US)

(73) Assignee: Strategic Energy Ltd., Newport Beach, CA (US)

( * ) Notice: Subject to any disclaimer, the term of this patent is extended or adjusted under 35 U.S.C. 154(b) by 0 days.

(21) Appl. No.: 07/929,345

(22) Filed: Aug. 12, 1992

Related U.S. Application Data

(63) Continuation of application No. 07/816,144, filed on Dec. 31, 1991, now Pat. No. 5,156,931.

(51) Int. Cl.7 .............................................. H01M 6/04
(52) U.S. Cl. ............................ 429/92; 429/90; 429/91
(58) Field of Search ............................... 324/104, 435, 324/437; 429/7, 90, 91, 92

(56) References Cited

U.S. PATENT DOCUMENTS

| | | |
|---|---|---|
| 394,100 A | 12/1888 | Currie |
| 945,564 A | 1/1910 | Marko |
| 964,994 A | 7/1910 | Marko |
| 1,010,377 A | 11/1911 | Kempf |
| 1,497,388 A | 6/1924 | Sterling |
| 2,900,434 A | 8/1959 | Zimmerman et al. |
| 2,921,254 A | 1/1960 | La Marche |
| 2,932,569 A | 4/1960 | Buchinski et al. |
| 2,971,044 A | 2/1961 | Zimmerman et al. |
| 2,980,754 A | 4/1961 | Reilly et al. |
| 2,988,590 A | 6/1961 | Andre |
| 3,054,030 A | 9/1962 | Evans et al. |
| 3,126,504 A | 3/1964 | Darland, Jr. et al. |
| 3,198,998 A | 8/1965 | Powers et al. |
| 3,214,647 A | 10/1965 | Louzos et al. |
| 3,223,639 A | 12/1965 | Powers et al. |
| 3,255,044 A | 6/1966 | Powers et al. |
| 3,255,045 A | 6/1966 | Powers et al. |
| 3,309,584 A | 3/1967 | Powers et al. |
| 3,379,574 A | 4/1968 | Grulke et al. |
| 3,383,580 A | 5/1968 | Wallace, Jr. |
| 3,494,796 A | 2/1970 | Grulke et al. |
| 3,500,372 A | 3/1970 | Thiele |
| 3,514,338 A | 5/1970 | Shakour |
| 3,534,354 A | 10/1970 | Galginaitis |
| 3,563,806 A | 2/1971 | Hruden |
| 3,667,039 A | 5/1972 | Garfein et al. |
| 3,720,869 A | 3/1973 | Rowlette |
| 3,764,893 A | 10/1973 | Weigand |
| 3,773,563 A | 11/1973 | Eaton, Jr. et al. |

(Continued)

FOREIGN PATENT DOCUMENTS

| | | |
|---|---|---|
| DE | 3100503 | 8/1982 |

(Continued)

OTHER PUBLICATIONS

Yam, P. *Plastics Get Wired, Scientific American* (Jul. 1995), pp. 83-87.

(Continued)

*Primary Examiner*—John S. Maples
(74) *Attorney, Agent, or Firm*—DeLio & Peterson, LLC; Peter W. Peterson

(57) ABSTRACT

A battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

6 Claims, 4 Drawing Sheets

U.S. PATENT DOCUMENTS

| | | | |
|---|---|---|---|
| 3,823,367 A | 7/1974 | Kaye et al. | |
| 3,921,049 A | 11/1975 | Mellors et al. | |
| 3,947,978 A | 4/1976 | Clark et al. | |
| 3,963,886 A | 6/1976 | Yen | |
| 3,992,228 A | 11/1976 | Depoix | |
| 4,006,414 A | 2/1977 | Parker | 324/106 |
| 4,027,231 A | 5/1977 | Lohrmann | |
| 4,048,388 A | 9/1977 | Chevet | |
| 4,057,730 A | 11/1977 | Dane | |
| 4,060,666 A | 11/1977 | Anes | |
| 4,118,112 A | 10/1978 | Thornburg | |
| 4,173,733 A | 11/1979 | Sugalski et al. | |
| 4,198,597 A | 4/1980 | Sawyer | |
| 4,231,026 A | 10/1980 | Sullivan | |
| 4,243,732 A | 1/1981 | Powers et al. | |
| 4,248,942 A | 2/1981 | Eby et al. | |
| 4,316,185 A | 2/1982 | Watrous et al. | |
| 4,324,962 A | 4/1982 | Dulen | |
| 4,340,448 A | 7/1982 | Schiller et al. | |
| 4,360,780 A | 11/1982 | Skutch, Jr. | 324/437 |
| 4,365,241 A | 12/1982 | Morishita | |
| 4,370,392 A | 1/1983 | Savinell et al. | |
| 4,371,827 A | 2/1983 | Mullersman et al. | |
| 4,379,816 A | 4/1983 | Mullersman et al. | 429/91 |
| 4,392,102 A | 7/1983 | Sugalski et al. | |
| 4,421,560 A | 12/1983 | Kito et al. | |
| 4,421,958 A | 12/1983 | Kameda | |
| 4,432,041 A | 2/1984 | Pfisterer et al. | |
| 4,456,798 A | 6/1984 | Iwai et al. | |
| 4,497,881 A | 2/1985 | Bertolino | 429/91 |
| 4,520,353 A | 5/1985 | McAuliffe | |
| 4,536,757 A | 8/1985 | Ijntema | |
| 4,539,507 A | 9/1985 | VanSlyke et al. | |
| 4,560,937 A | 12/1985 | Finger | |
| 4,563,629 A | 1/1986 | Keiper | |
| 4,571,292 A | 2/1986 | Liu et al. | |
| 4,626,765 A | 12/1986 | Tanaka | |
| 4,655,880 A | 4/1987 | Liu | |
| 4,701,835 A | 10/1987 | Campagnuolo et al. | |
| 4,702,563 A | 10/1987 | Parker | 350/351 |
| 4,702,564 A | 10/1987 | Parker | 350/351 |
| 4,723,656 A | 2/1988 | Kiernan et al. | 206/333 |
| 4,725,784 A | 2/1988 | Peled et al. | |
| 4,726,661 A | 2/1988 | Parker | 350/351 |
| 4,727,006 A | 2/1988 | Malinowski et al. | 429/50 |
| 4,737,020 A | 4/1988 | Parker | 350/351 |
| 4,769,292 A | 9/1988 | Tang et al. | |
| 4,775,964 A | 10/1988 | Alessio et al. | |
| 4,784,924 A | 11/1988 | Savinell et al. | |
| 4,801,514 A | 1/1989 | Will et al. | |
| 4,835,475 A | 5/1989 | Hanakura et al. | 324/435 |
| 4,835,476 A | 5/1989 | Kurosawa | 324/435 |
| 4,855,195 A | 8/1989 | Georgopoulos et al. | |
| 4,876,632 A | 10/1989 | Osterhout et al. | |
| 4,902,108 A | 2/1990 | Byker | |
| 4,911,994 A | 3/1990 | Will et al. | |
| 4,917,973 A | 4/1990 | Yoshimoto et al. | |
| 4,924,176 A | 5/1990 | Tremblay | 324/133 |
| 4,962,347 A | 10/1990 | Burroughs et al. | |
| 5,015,544 A | 5/1991 | Burroughs et al. | 429/93 |
| 5,057,383 A | 10/1991 | Sokira | |
| 5,059,895 A | 10/1991 | Cataldi et al. | 324/104 |
| 5,105,156 A | 4/1992 | Bohmer | |
| 5,128,616 A | 7/1992 | Palmer | |
| 5,130,658 A | 7/1992 | Bohmer | |
| 5,132,176 A | 7/1992 | Valentine et al. | |
| 5,156,931 A | 10/1992 | Burroughs et al. | |
| 5,188,231 A | 2/1993 | Kivell et al. | |
| 5,223,003 A | 6/1993 | Tucholski et al. | |
| 5,231,356 A | 7/1993 | Parker | |
| 5,240,022 A | 8/1993 | Franklin | |
| 5,247,190 A | 9/1993 | Friend | |
| 5,250,905 A | 10/1993 | Kuo et al. | |
| 5,262,728 A | 11/1993 | Shershen | |
| 5,389,458 A | 2/1995 | Weiss et al. | |
| 5,393,618 A | 2/1995 | Weiss et al. | |
| 5,405,710 A | 4/1995 | Dodabalapur et al. | |
| 5,409,788 A | 4/1995 | Weiss et al. | |
| 5,418,085 A | 5/1995 | Huhndorff et al. | |
| 5,478,665 A | 12/1995 | Burroughs et al. | |
| 5,538,806 A | 7/1996 | Weiss et al. | |
| 6,184,794 B1 | 2/2001 | Tucholski | |

FOREIGN PATENT DOCUMENTS

| | | |
|---|---|---|
| EP | 0495636 A2 | 7/1992 |
| EP | 0497616 A2 | 8/1992 |
| EP | 0497617 A2 | 8/1992 |
| EP | 0501609 A1 | 9/1992 |
| EP | 0523901 A1 | 1/1993 |
| EP | 0450938 B1 | 12/1995 |
| GB | 1153226 | 5/1969 |
| GB | 011698 A2 | 7/1979 |
| JP | 57-153275 A | 9/1982 |
| JP | 60-52189 B2 | 11/1985 |
| JP | 63-179269 | 7/1988 |
| JP | SHO 63-213256 | 9/1988 |
| JP | 1-313379 A | 12/1989 |
| JP | HEI 2-41365 | 3/1990 |
| JP | 2-100-269 A | 4/1990 |
| JP | 4-329385 A | 11/1991 |
| JP | 4-329384 A | 11/1992 |
| NL | 8600282 A | 9/1987 |
| WO | WO92/03852 | 3/1992 |
| WO | WO92/13368 | 8/1992 |

OTHER PUBLICATIONS

Parker, R. *Solid State RMS Recording Ammeter*, IEEE Power Engineering Society Summer Meeting, San Francisco, CA (Jul. 9-14, 1972), pp. 104-107.

*Eveready Battery Engineering Data*, vol. III (1984) pp. 29-31.

Franzese, K and Bharucha, N., "*The Zinc-Carbon (Leclanche) Cell*", Chapter 5, no date.

Nazarenko, N. and Lazaridis, C. N. *Polymer Thick Film Conductors and Dielectrics for Membrane Switches and Flexible Circuitry*, E. I. du Pont de Nemours & Company, Inc., Wilmington, DE 19898, no date.

Powers, R. *Batteries for Low Power Electronics*, *Proceedings of the IEEE*, vol. 83, No. 4, (Apr. 1995), pp. 687-693.

*Pilgrim Battery Tester* Pilgrim Plastics Products Company, Boston, Massachusetts. (Jun. 17, 1986).

*Pilgrim's BATCHECK® Battery Tester/Digitemp® Battery Tester*, no date.

*TEKNA-LITE™ with Battery Life Indicator*, 101 Twin Dolphin Drive, Redwood City, CA 94065, no date.

Hill, M., *Lit up*, *Plain Dealer Reporter*, no date.

Gibson, R. *Battle Over New Battery May Keep Going and Going*, *The Wall Street Journal* (Jan. 2, 1996).

Fox, B. *Battery giants ready for battle over patent*, *New Scientist* (Mar. 16, 1996).

Gibson, R. *Eastman Kodak Isn't Entitled to Patent For Battery Tester*, *U.S. Agency Rules*, *The Wall Street Journal* (Jan. 8, 1998).

Banerjee, N. *Duracell Gets Charge From Russian Sales*, *The Wall Street Journal*, no date.

BATCHECK® Battery Tester, 2 pages, features and instructions, no date.

BATTERY WITH STRENGTH INDICATOR

This is a continuation Ser. No. 07/816,144 filed on Dec. 31, 1991, now U.S. Pat. No. 5,156,931.

FIELD OF THE INVENTION

The present invention relates to an improved battery having a built-in strength indicator device for determining the strength, voltage, or capacity of the battery. More particularly, the present invention relates to a battery having an indicator cell which visually indicates when the battery is above or below a predetermined voltage value, an LED array which indicates when the battery is above or below a predetermined voltage value, or a redox cell which indicates when the voltage output is above or below a predetermined voltage by a color change.

BACKGROUND OF THE INVENTION

Batteries are employed extensively in this country and abroad for automobiles, home uses, industrial uses, recreational uses, and military uses. A battery is normally tested by measuring its voltage output without a load. If the voltage is below a predetermined value, and the voltage characteristics of the battery with respect to the battery's capacity are known, one can determine whether the battery has sufficient capacity to perform a desired function. A more accurate indication of the battery's condition can be determined by noting the voltage drop of the battery under a load. A well-charged battery will experience only a slight voltage drop under a load, whereas a depleted battery will undergo a significant voltage drop under a load. For a wet-cell battery, the work capacity of the battery can frequently be determined by measuring the specific density of the electrolyte.

A dry-cell battery does not have a reservoir liquid electrolyte; thus, its capacity cannot be determined by taking specific gravity measurements. In addition, voltmeters are expensive, as are devices for measuring the voltage output of a battery, both under a load and under no load. Accordingly, most batteries are purchased or used without the purchaser/user knowing the true condition of the battery.

Recently, the manufacturer of DURACELL-brand batteries has been date-marking its packages to indicate by which date the battery should be in use. Although this date-stamping may be of some benefit to purchasers, it does not tell the purchaser the actual condition of the battery. Moreover, date-stamping of the package does not include date-stamping of the battery; thus, the purchaser has no idea of the use-date of a particular battery once it has been removed from the package.

Our related U.S. patent application identified above discloses a flashlight with a built-in battery tester having a voltmeter, ammeter, or visual-indicating chemical or LED cell to indicate when the battery's voltage output is above or below a predetermined value.

Flashlights, portable lanterns, portable radios and television, cameras, video recorders, portable dictating machine, and the like are used extensively in this country and abroad. Almost every home and business has at least one flashlight or portable lantern and a radio. Many home and businesses have numerous devices, such as recorders, portable radios and televisions, video recorders, calculators, cameras, and the like, which utilize batteries for their energy source. Some of the devices, such as flashlights, are used on an infrequent basis, that is, during an emergency situation where there has been a power failure or when it is not convenient to use a light source powered by conventional household current, such as for outdoor use or use in an unlighted attic or crawl space. Other devices, such as portable radios, are used extensively. The majority of these battery powered devices use dry-cell nonrechargeable batteries. Nonrechargeable alkaline batteries sold under the trademarks EVEREADY, DURACELL, RAY-OVAC, and the like, have a number of advantages over rechargeable batteries. On a weight-to-weight and volume-to-volume basis, the alkaline battery can supply three to four times the wattage of a rechargeable battery. In addition, nonrechargeable dry-cell rechargeable batteries put out a higher voltage than dry-cell rechargeable batteries. Many dry-cell rechargeable batteries, even if not in use, have to be periodically charged to keep the batteries from falling below a defined charge level to prevent permanent damage to the batteries. Alkaline batteries, which are used frequently, can have a shelf or storage life of from three to five years. During this period, no maintenance of the battery is required. In contrast, most rechargeable batteries wet-cell and dry-cell will completely discharge within six months or less of their last recharge.

Most individuals test their batteries by turning on the device in which the batteries are installed. If the device operates, the individual is normally satisfied that the batteries are operational. Some individuals will test the batteries on a battery tester to determine the condition of the batteries. Some individuals will even test the batteries under both loaded and unloaded conditions to measure the voltage drop. Although it is not complicated to test batteries, it is time consuming to disassemble a device, remove the batteries, test the batteries, and, if they pass the test, reinstall the batteries in the device. It is normally not possible to test new batteries at the time of purchase because of the battery protective packaging.

Accordingly, it is the object of the present invention to provide an improved battery having a built-in battery-strength indicator which permits one to immediately determine the battery's strength or condition. Thus, with the improved battery of the present invention, a user can quickly and effortlessly determine the strength or condition of a battery. When a batter is easily tested, as the battery of the present invention, the user of the battery is more likely to routinely check the condition of the battery.

SUMMARY OF THE INVENTION

The present invention is directed to an improved battery comprising a battery and a battery-strength indicator means to indicate the strength of the battery when electrically connected to the battery. Optionally, the battery will include a switch means adapted in an "on" position to electrically connect and complete a circuit between the battery and the indicator means.

In a preferred embodiment shown further herein, the improved battery having a battery strength indicator comprises a dry cell battery having a first terminal and a second terminal; a battery indicator formed in a layer attached to a side of the battery which undergoes a visible change when subject to a predetermined voltage potential and a first conductor electrically connected between one end of the indicator and the first battery terminal; and a battery switch comprising a resilient, nonconductive, deformable layer disposed over the side of the battery, a switch chamber formed beneath the resilient layer, and a second conductor extending from the chamber and connected to the other end of the indicator, the portion of the second conductive lead within the switch chamber comprising a switch contact, the battery switch being biased in an electrically open position. Upon pressing of the resilient layer over the switch chamber, the switch contact will be placed in electrical contact with a conductive layer in electrical contact with the second battery terminal, thereby placing the indicator in electrical contact across the terminals of the battery to quickly indicate to the user the strength of the battery.

In another preferred embodiment shown herein, the improved battery having a battery strength indicator comprises a dry cell battery having a first terminal and a second terminal; a battery indicator attached to a side of the battery which undergoes a visible change when subject to a voltage potential which exceeds or drops below a predetermined value and a first conductor electrically connected between one end of the indicator and the first battery terminal; and a battery switch comprising a resilient, nonconductive, deformable layer disposed over the side of the battery, a switch chamber formed beneath the resilient layer, a second conductor extending from one end of the chamber and connected to the other end of the indicator, and a third conductor extending from the other end of the chamber to the second battery terminal, the battery switch being biased in an electrically open position. Upon pressing of the resilient layer over the switch chamber, the switch places the indicator in electrical contact across the terminals of the battery to quickly indicate to the user the strength of the battery.

In yet another embodiment, the invention is directed to a strip or label for application to a battery which includes an integral battery-strength indicator or voltmeter which comprises a first nonconductive insulating or dielectric base layer and a conductive layer above and in contact with the base layer. A nonconductive insulating or dielectric layer may be provided over and in contact with the conductive layer. A heat or temperature sensitive, color indicating layer thermally contacts the conductive layer. The conductive layer has sufficient heat generating capacity when subject to a predetermined voltage to cause a color change in the temperature sensitive, color indicating layer. The conductive layer is preferably formed with a reduced cross sectional area to have a resistance such that current flow at a minimum predetermined voltage through the conductive layer will raise the area to a predetermined temperature. The base layer is of sufficient thickness to provide thermal insulation to overcome heat sinking under the conductive layer and permit the temperature sensitive, color indicating layer to function when the strip containing the battery strength indicator or voltmeter is applied to the side or housing of a battery, which battery typically has an electrically conductive housing. The strip comprising the battery-strength indicator or voltmeter also includes switch means adapted to make electrical contact with a terminal of the battery, which terminal may comprise the electrically conductive battery housing.

The battery-strength indicator means can comprise a nonconductive base layer; a nonconductive top layer attached to the base layer, a portion of the top layer and base layer forming a chamber therebetween; first and second conductive means separately and independently positioned between the top layer and the base layer and extending into the chamber, the ends of the conductive means in the sealed chamber forming electrodes, the other ends of the conductive means adapted to electrically connect to the battery; and indicator means in the sealed chamber adapted to undergo a visible change when the voltage potential across the electrode exceed or crosses a predetermined voltage. The indicator means can be a liquid-crystal composition that changes phases when the field between the electrodes or plates exceeds or crosses a predetermined voltage value. Preferably the chamber is sealed.

In an alternative embodiment of the present invention, the battery strength indicator means comprises a first nonconductive layer; a second nonconductive layer attached to the first layer, a portion of the first and second layers forming a chamber therebetween, the chamber having first and second internal opposing walls; a third nonconductive layer having a high dielectric constant attached to the first internal wall of the chamber; a first conductive plate means sandwiched between the third insulating layer and the first internal wall and isolated from the chamber; a second conductive plate means on the second internal wall; first and second conductive means separately and independently positioned between the first and second nonconductive layer, the ends of the conductive means electrically connected to the first and second conductive plate means respectively, the other ends of the conductive means adapted to be electrically connected to the battery; and a liquid-crystal composition in the sealed chamber adapted to undergo a visible phase change when the electric field between the first and second plate means "exceeds or crosses a predetermined value. Preferably the chamber is sealed.

One embodiment of the switch means of the present invention comprises a nonconductive base layer; a resilient nonconductive top layer attached to the base layer, a portion of the top and base layers forming a chamber having first and second internal spaced apart opposing wells; a first contact means on the first internal wall of the chamber; a second contact means on the second internal wall of the chamber; first and second conductive layers independently and separately sandwiched between the top layer and the base layer and connected to the first and second plate means respectively, the top layer about the chamber adapted to be pushed toward the base layer so that the first and second contact means come in contact to permit current to flow from the first conductive means to the second conductive means.

In an alternative embodiment of the switch means of the present invention, the switch means comprises a nonconductive base layer; a resilient nonconductive top layer attached to the base layer, a portion of the top and base layers forming a chamber having first and second internal spaced apart opposing walls; first and second spaced apart conductive contact means on the first internal wall of the switch chamber; third conductive contact means on the second internal wall of the chamber; and first and second conductive means independently and separately sandwiched between the top layer and base layer and connected to the first and second conductive contact means respectively, the top layer about the chamber adapted to be pushed toward the base layer so that the third conductive contact means contacts the first and second conductive contact means to complete an electrical connection with the first and second conductive contact means.

In another embodiment of the present invention, the battery-strength indicator means comprises a first nonconductive layer; a second nonconductive layer attached to the first nonconductive layer, a portion of the first and second nonconductive layers forming a chamber therebetween; a conductive layer sandwiched between the first and second nonconductive layers, the conductive layer reduced to a small cross-sectional area in the chamber; and a heat sensitive color-indicating material in the sealed chamber that is adapted to undergo a color change when its temperature exceeds or crosses a predetermined value, the conductive layer in chamber rising to a predetermined temperature when the voltage of the current flowing therethrough exceeds a predetermined value.

In a further embodiment of the present invention, the battery-strength indicator means comprises a first nonconductive layer; a second nonconductive layer attached to the first nonconductive layer, a portion of the first and second nonconductive layers forming a chamber therebetween; a conductive layer sandwiched between the first and second nonconductive layers, the conductive layer reduced to a small cross sectional area in the chamber; a pyrotechnic material contained within the chamber and adapted to decompose when the temperature of the first section of the conductive layer in the chamber exceeds a predetermined temperature, the first section of the conductive layer adapted to exceed the predetermined temperature when the voltage of the current through the conductive layer in the chamber exceeds a predetermined value.

In a further embodiment of the present invention, the battery-strength indicator means comprises a first nonconductive layer; a second nonconductive layer attached to the first nonconductive layer, a portion of the first and second nonconductive layers forming a chamber therebetween; and a conductive layer sandwiched between the first and second nonconductive layers, the conductive layer reduced to a small cross sectional area in the chamber such that when the voltage of current flow through the conductive layer in the chamber exceeds a predetermined value, the temperature of the conductive layer in the chamber exceeds the melting temperature of the conductive layer causing the conductive layer to melt and form an open circuit.

The invention also comprises an improved battery package having a battery-strength indicator means comprising at least one battery; a battery-strength indicator means comprising a battery-strength indicator device for indicating the strength of the battery when electrically connected to the battery; and conductive means adapted to electrically connect the indicator device to the battery; and packaging means for the battery and battery-strength indicator means.

The deformable, nonconductive strip layer or layers employed in connection with the battery strength indicator and switch may be made of plastic film such as adhesive tape for application to the battery housing or battery packaging. Preferably the chambers of the battery strength indicators are sealed chambers.

DETAILED DESCRIPTION OF THE INVENTION

Figure 1:
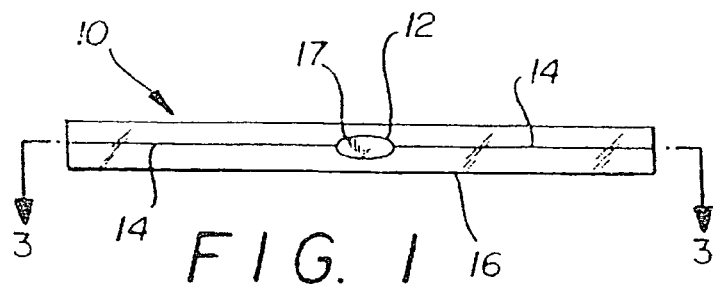
FIG. 1 is a top view of a battery-strength indicator device of the present invention.

Referring to FIG. 1, a battery-strength indicator device 10 of the present invention is illustrated. The indicator device has an indicator chamber, cell or bubble 12 formed in strip 16. Preferably the cells of the present invention are sealed cells. Conductive layers 14 run the length of the strip into the indicator bubble to form spaced apart electrodes. The indicator bubble contains an indicating material 17 which undergoes a visible change when the voltage potential across the indicator cell exceeds a predetermined value. At least one side of the strip 16 is transparent or translucent.

Figure 1A:
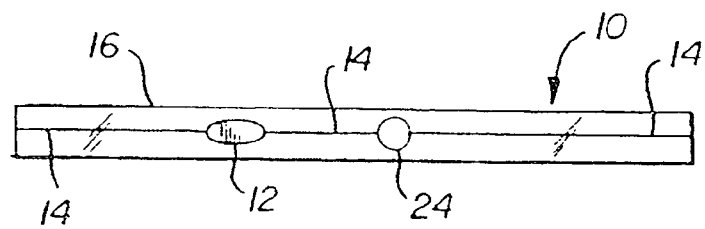
FIG. 1A is a top view of a battery-strength indicator device of the present invention with a switch.
Figure 2:
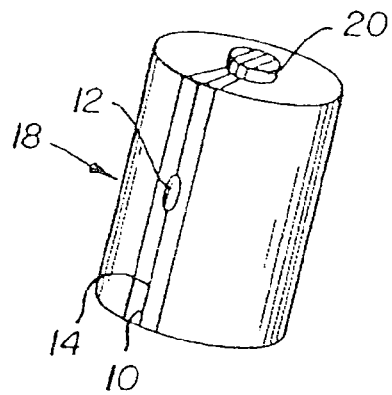
FIG. 2 is a perspective view of a battery of the present invention having a battery-strength indicator device.

The improved battery 18 of the present invention is illustrated in FIG. 2. The battery has an anode 20 and a cathode at its base (not shown). The indicator device 10 is attached to the side of the battery, with the ends of the device connected to the anode 20 and the cathode. If the device is a constant-drain device, that is, the device is on continuously, the indicator cell undergoes a visible change when the output voltage of the battery drops below a predetermined value. In an alternative embodiment of the invention, the battery has the indicator device of FIG. 1A, which includes a strip 16, conductive leads 14, an indicator cell 12, and a switch 24. The switch is biased to be in an "off" position, and, thus, the indicator device is only actuated when the switch is "on", thus preventing a constant drain on the battery.

Figure 3:
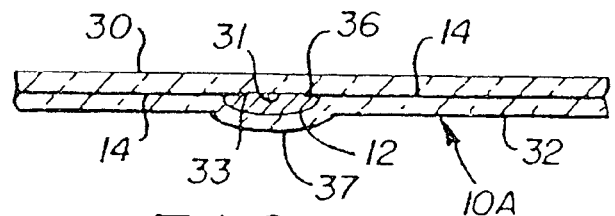
FIG. 3 is a vertical, sectional view along lines 3—3 of FIG. 1.

Referring to FIG. 3, the indicator device 10A comprises a first layer 30, a second layer 32, and a conductive layer or lead 14 sandwiched between the first and second layers. The end of the conductive leads extend into the indicator chamber or cell 12, which is filled with an indicator material 33. The ends of the conductive leads form electrodes 36. The second layer of the device of FIG. 3 is formed with the bulge 37 which forms one side of the cell. The other side of the cell is formed by the first layer. The first layer can be a clear material, a translucent material, or an opaque material. The second layer is preferably a clear or translucent material. The first layer can be an opaque material as long as the bulge area is clear or translucent. If the first layer is opaque, the inner side 31 of the first layer can be coated with a reflective material such as aluminum or aluminum foil, or a highly reflective white material to enhance-visibility of the indicator material.

The indicator material can be any material that will undergo a visible change, such as a color change, when the voltage potential across the electrodes exceeds or drops below a predetermined voltage. For example, the material can be a redox composition, such as the composition in the U.S. Sterling U.S. Pat. No. 1,497,388, or the compositions disclosed by H. A. Fales and F. Kenny, INORGANIC QUANTITATIVE ANALYSIS, 1939, pp. 391–393, or the like. Alternatively, the composition can be a liquid-crystal composition, such as one of the compositions disclosed in Kirk-Othmer, ENCYCLOPEDIA OF CHEMICAL TECHNOLOGY, 3rd Ed., John Wiley & Sons, Vol. 7, pp. 724–751 and Vol. 14, pp. 395–427.

The voltage color-indicating device of the present invention comprises a sealed cell having at least one transparent or translucent window. The cell is filled with an aqueous or non-aqueous composition, such as an aqueous phenophthalein solution. Two spaced-apart electrodes of the cell are in contact with the color-indicating solution. When a voltage potential is induced across the electrodes, a redox reaction occurs which can cause a color change in the color-indicating solution. Each solution has its own unique threshold voltage wherein the redox reaction will commence. If the voltage of the battery is below that threshold voltage, no redox reaction will occur and there will be no color change.

Figure 4:
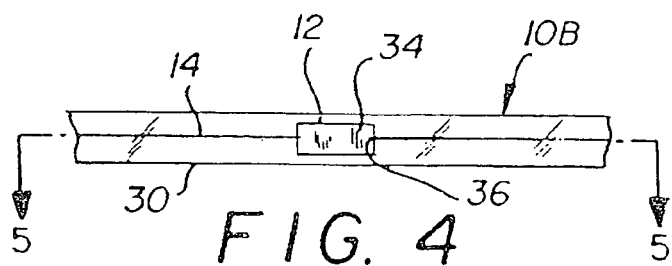
FIG. 4 is a top plan view of a battery-strength indicator device of the present invention.
Figure 5:
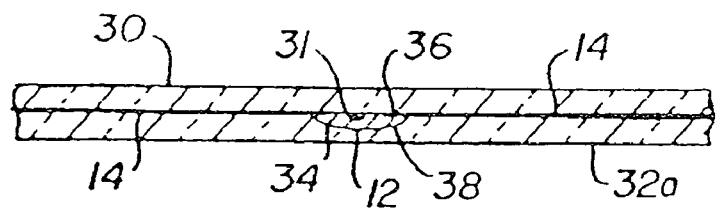
FIG. 5 is a vertical, sectional view along line 5—5 of FIG. 4.

An alternative embodiment of the battery-strength indicator device 10B of the present invention is illustrated in FIGS. 4 and 5. The indicator device 10B has a first layer 30, and a second layer 32a, and conductive leads or layers 14 sandwiched therebetween. The second layer 32a has a depression or cavity 38 which defines one side of the indicator cell 12; the other side of the cell being defined by the inner surface 31 of the first layer 30. The cavity is illustrated with curved surfaces, it can also have straight sides arranged in perpendicular or nonperpendicular fashion. One or both of the layers are transparent or translucent. Although the drawing illustrates the layers as being relatively thick, in actual practice the layers can be quite thin, such as 1 or 2 mils, with the cell having a maximum height or depth of 0.5 or 1 mil.

Figure 6:
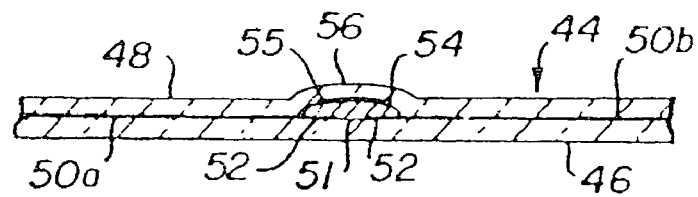
FIG. 6 is a vertical, sectional view of a switch of the present invention with the switch in the "off" position.
Figure 7:
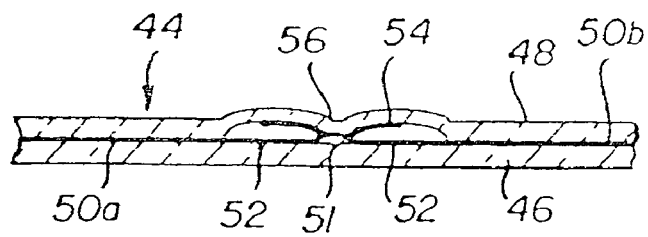
FIG. 7 is a vertical, sectional view . . . of a switch of the present invention with the switch in the "on" position.

One embodiment of the switch 44 of the present invention is illustrated in FIGS. 6 and 7. The switch 44 has a base layer 46 and a resilient top layer 48, which is attached to the base layer. Conductive leads or layers 50a and 50b are sandwiched between the two layers. The conductive layer 50a on the left side of the device is separated from the conductive layer 50b on the right side of the device by spacing 51. A portion of the top layer is bulged out to form a bubble element 56. A conductive strip or coating 54 is attached to the inner side 55 of the bubble element. The bubble element is biased away from the base layer 46 as shown in FIG. 6 so that the conductive strip or coating does not come in contact with the switch contacts 52. Thus, the switch is normally in the "off" position. When the bubble element is pressed downwardly towards the base layer as shown in FIG. 7, the conductive strip 54 contacts the switch contacts 52; thus bridging the contacts and permitting current flow across the contacts between the conductive leads or layers 50a and 50b, as illustrated in FIG. 7. When pressure is removed from the bubble element, the bubble element biases away from the base layer, breaking contact between the two contacts 52.

Figure 8:
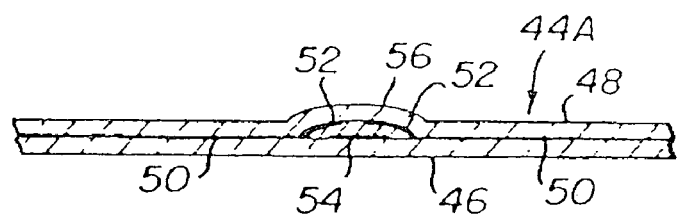
FIG. 8 is a vertical, sectional view of an alternative switch of the present invention.

An alternative embodiment of the switch 44A of the present invention is illustrated in FIG. 8. This switch has a base layer 46, a resilient top layer 48, and conductive leads or layers 50 sandwiched between the two layers. The top layer is bulged out to form a bubble element 56. The switch contacts 52 are located on the inner sides of the bubble element. A conductive strip 54 or coating is attached to the inner side of the base layer 46. This switch operates in the same manner as does the switch of FIGS. 6 and 7. The bubble element is depressed to have the switch contacts 52 make contact with the conductive strip 54; thus, electrically bridging the two contacts. The bubble element is biased away from the top layer so that the switch is normally in an "of f" position. When pressure is removed from the bubble element, the bubble element biases away from the conductive strip; thus, breaking contact between the switch contacts and the conductive strip.

Figure 9:
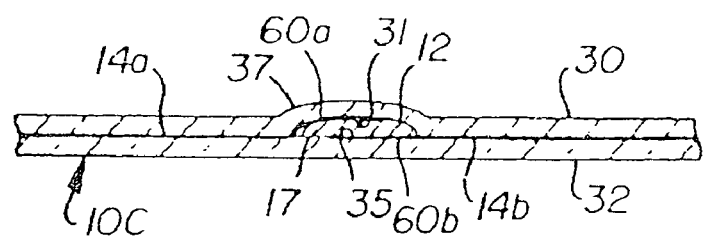
FIG. 9 is a vertical, sectional view of an alternative embodiment of the battery-strength indicator device of the present invention.

Another embodiment of the battery-strength indicator device of the present invention is illustrated in FIG. 9. The device loc has a first layer 30 and a second layer 32. Conductive layers 14a and 14b are independently and separately sandwiched between the first and second layers on the left and right sides respectively of the device. A portion of the first layer is formed into a bulge 37 to form the indicator cell 12. A plate or electrode 60a is attached to the inner surface 31 of the top layer within the cell and is electrically connected with conductive layer 14a. A second plate or electrode 60b is attached to the inner side 35 of the second layer 32 within the indicator cell and is electrically connected to the conductive layer 14b. The indicator cell is filled with an indicator material 17, such as the material described above. At least one of the layers and its attached plate are transparent or translucent (or one of the layers is transparent or translucent and its attached plate is extremely thin) so that changes to the indicator material are visible.

The basic architecture of the indicator device of FIG. 9 can also be utilized for another embodiment of the switch of the present invention. When the architecture Is employed as a switch, the bulge 37 is biased away from the second layer 32, and the indicator cell is not filled with an indicator material. Two switch contacts replace the electrodes 60a and 60b and the switch operates when the bulge is depressed downwardly to make contact between the switch contact attached to the inner side of the first layer and the switch contact mounted on the inner side of the second layer.

Figure 10:
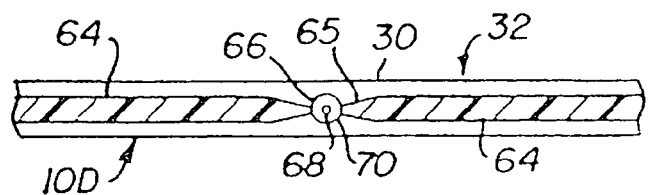
FIG. 10 is a top plan view of another alternative embodiment of the battery-strength indicator device of the present invention.

Another embodiment of the battery-strength indicator device of the present invention is shown in FIG. 10. The indicator device 10D is a strip like device having first and second superimposed layers 30 and 32 which are attached together in the same manner as strips 30 and 32 in FIG. 3. At least one of the strips is transparent. Conductive layers 64 are sandwiched between the first and second layers. The conductive layer is reduced to a small cross-section 65 in the indicator zone 66. Within the indicator zone, the conductive layer is covered with a small amount of a pyrotechnic chemical 68 sensitive to heat. Surrounding the pyrotechnic chemical is a color indicating, heat-sensitive material 70 which will undergo a visible color change, either permanent or temporary, when the material is heated to at least a predetermined temperature. This battery-strength indicator device is a one-shot device; the pyrotechnic chemical will only decompose or react once. The pyrotechnic chemical undergoes rapid decomposition when it is heated to a predetermined temperature. The resistance of the conductive layer in the reduced cross-sectional area 65 is selected such that current flow at a minimum predetermined voltage through the conductive layer will raise the area to a predetermined temperature which will cause the pyrotechnic chemical to decompose or otherwise react. The pyrotechnic chemical in turn will raise the temperature of the color-indicating, heat sensitive material to the predetermined temperature for color change.

Although the indicator device of FIG. 10D is shown with a color-indicating, heat-sensitive material, the device can also be fabricated with the pyrotechnic chemical alone, thereby causing a slight charring to the strip which is noticeable. One of the strips can also be made of a material that is sensitive to temperature and will undergo a visible change when the temperature exceeds a predetermined value. Alternatively, the device can be fabricated without the pyrotechnic chemical, relying on the color-indicating, heat-sensitive material alone to indicate whether the battery has a predetermined minimal voltage output. If the color indicating, heat-sensitive material undergoes a non-permanent color change when exposed to a predetermined temperature, then the battery-strength indicator device of FIG. 10D can be used repeatedly to determine if the output voltage of the battery meets a predetermined voltage level.

Figure 11:
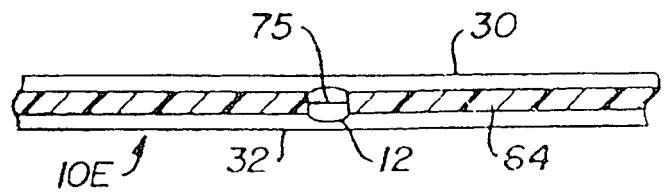
FIG. 11 shows a top plan view of still a further embodiment of the battery-strength indicator device of the present invention.

A further embodiment of the battery-strength indicator device of the present invention is illustrated in FIG. 11. The battery-strength indicator device 10E has first and second layers 30 and 32 which are sandwiched together like layers 30 and 32 in FIG. 3. The conductive layers 64 are sandwiched between the first and second layers. The conductive layer is reduced to a small cross-section area 75 within the indicator cell 66. The resistance of the conductive layer and the cross-sectional area 75 are selected such that the current flow of a predetermined minimum voltage potential through the conductive layer will melt the area 75 in the fashion of a fuse element, causing conductive strip in area 75 to become an open circuit. The vaporization of the melted conductive strip forms a visible sign that the area 75 was heated to a predetermined temperature which can only be achieved when the device is subject to a predetermined minimum voltage.

Figure 12:
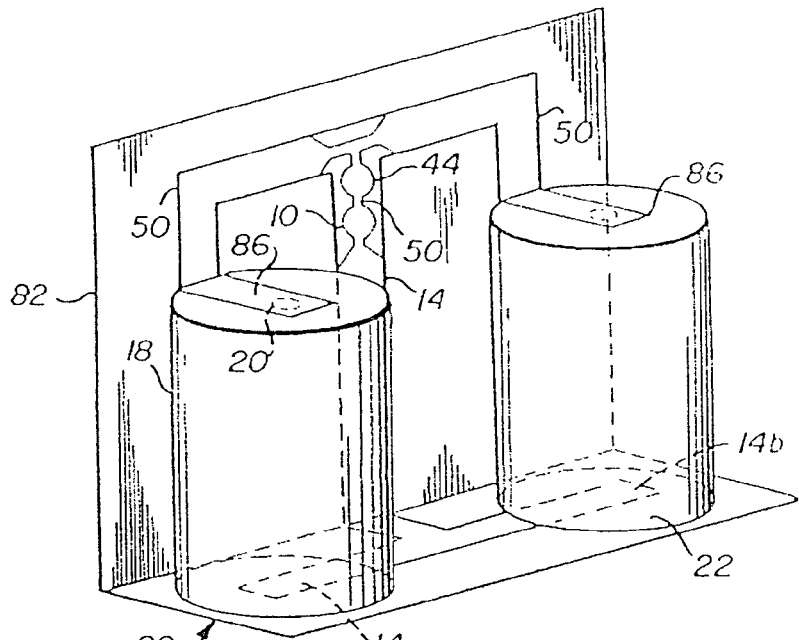
FIG. 12 is a perspective view of the battery packaging of the present invention having a battery-strength indicator device.
Figure 13:
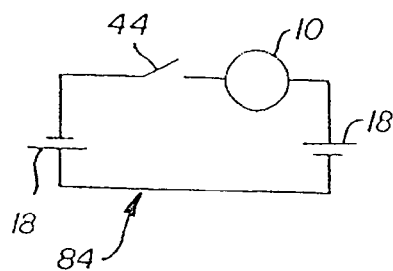
FIG. 13 is a schematic diagram of the battery packaging circuitry of the present invention having a battery-strength indicator device.

Another embodiment of the invention is shown in FIGS. 12 and 13. A battery package 84 comprises two batteries 18 mounted on a package frame 82. Conductive leads 14a and 14b are affixed to the base of the frame in electrical contact with the cathode 22 of the battery. A conductive lead 14 connects the leads 14a and 14b with a battery strength-indicator 10, such as the ones described herein. A conductive layer 50 connects the indicator 10 with the switch 44 which in turn is connected to a conductive T-connection 86. The T-connection is electrically connected to the battery anodes 20 via conductive layer 50 and conductive flaps 86. The package is intended to be covered with a transparent cover giving physical access to the switch 44 and visual access to the indicator 10. In the embodiment of FIG. 12 the batteries are in parallel. FIG. 13 illustrates the circuitry of a battery package containing two batteries that are connected in series to the switch 44 and indicator 10.

In the preferred embodiment of the conductive leads, switch and indicator are layers attached to the package frame. The conductive leads may be printed or silk screened directly on the package frame. The package frame can be the base nonconductive layer for the switch 44 and indicator 10.

Figure 14:
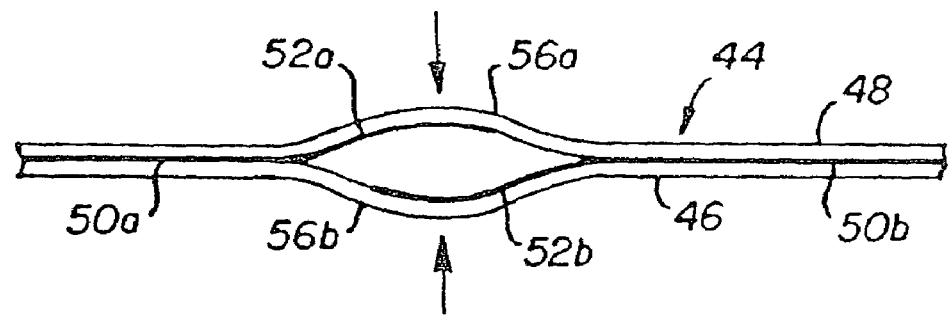
FIG. 14 is a vertical, sectional view of an alternative embodiment of the switch of the present invention.

Another embodiment of the switch 44 of the present invention is illustrated in FIG. 14. The switch has a base layer 46 and a top layer 48, which is attached to the base layer. Conductive leads or layers 50a and 50b are sandwiched between the two layers. The conductive layer 50a on the left side of the device is formed into switch contact 62a in chamber 40 and the conductive layer 50b on the right side of the device is formed into switch contact 52b in the chamber. A portion of the top layer and bottom layer are bulged out to form bubble elements 56a and 56b. The bubble elements are biased away from each other so that the switch contacts do not come in contact. Thus, the switch is normally in the "off" position. When the bubble elements are pressed together as shown by the arrows in FIG. 14, the switch contacts come in contact permitting current flow across the contacts and the conductive leads or layers 50a and 50b. When pressure is removed from the bubble elements, the bubble elements bias away from each other, breaking contact between the two switch contacts.

The present invention permits the user of a batter to quickly determine whether the capacity of the battery is above or below a given point without the use of a voltmeter and/or ammeter. The approximate capacity of a battery can be determined by the battery's no load output voltage. The indicator device of the present invention can be fabricated so that it indicates a particular no-load voltage threshold. For example, one can select a voltage threshold which is indicative that the battery is about 20% exhausted, or about 50% exhausted—whatever is suitable for the intended purpose.

The indicator having a liquid-crystal composition comprises a sealed, fully-enclosed cell containing the liquid-crystal composition. Preferably, one side of the cell will be transparent, and not merely translucent. The base layer of the liquid-crystal indicator call can be a high-dielectric material, optionally coated with a dielectric mirror in contact with the liquid-crystal composition. The top layer is preferably transparent and, optionally, has a transparent, conductive coating applied to the surface in contact with the liquid-crystal composition. A voltage differential is induced across the liquid-crystal composition to either the base high-dielectric material or the high-dielectric transparent top layer to induce electric field. An electric field change can cause changes in the optical properties of liquid crystals, such as when a liquid crystal changes from a nematic phase to a smectic phase. Such field are easily achieved, even with small voltage inputs from batteries, by employing a high-dielectric base material and/or a high dielectric top layer material. Thus, when the liquid-crystal detector of the present invention is in a non-energized state, it will have one optical appearance characteristic of the 'at rest' phase of the liquid crystal. When the indicator device is activated, and a field is generated across the liquid-crystal composition, the liquid-crystal composition will transform into another phase. Alternatively, the indicator can remain in an "always on" condition and provide a constant indication of battery strength. If batteries do not have sufficient voltage to achieve the threshold high-dielectric field, thereby changing the liquid-crystal composition from one phase to the other, no change will be observed. Thus, each liquid-crystal indicator cell will be tailored by controlling the thickness of the dielectric material in the sandwich, the distance between the plates or electrodes, and the dielectric composition. Typical liquid-crystal compositions that can be employed include methoxybenzylidenebutylaniline and terephthal-bis-p-butylaniline.

Figure 15:
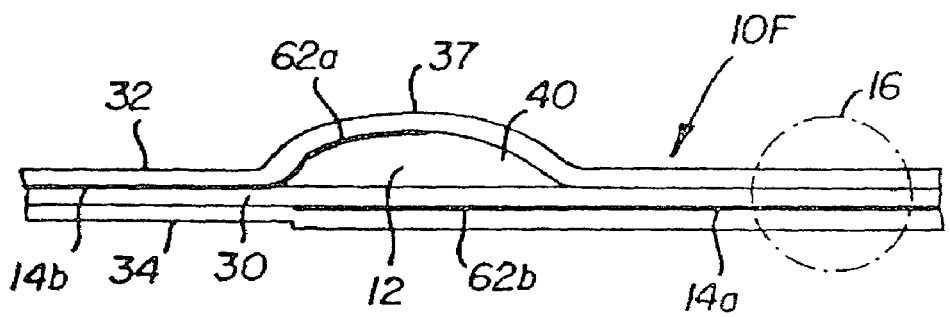
FIG. 15 is a vertical, sectional view of another embodiment of the battery-strength indicator device of the present invention.
Figure 16:
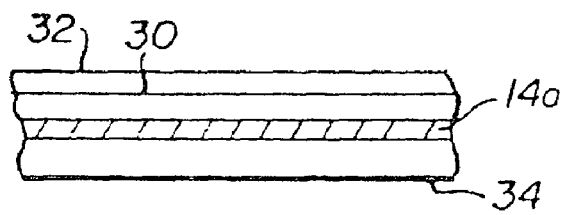
FIG. 16 is an enlarged, sectional view within encircled line 16 of FIG. 15.

In the indicator device of FIG. 15, the electrodes 62b and 62a are independently and separately sandwiched between the first high dielectric constant layer and the third nonconductive layer 30 and 34 and the first layer and second nonconductive layers 30 and 32, respectively. A bulge extending outwardly from the he first layer is formed in the second layer to form an indicator cell 40. Within the cell on the inner side of the second layer 32 and a plate 62a is attached or coated and electrically connected to lead 14b. Plate 62b is positioned below the indicator cell between the first and third layers and is electrically connected to conductive layer 14a. The indicator cell 12 is filled with a liquid-crystal composition 40. The second layer and plate 62a and/or the first and third layers and plate 62b are transparent or translucent so that changes to the liquid-crystal composition 40 are visible. The bottom of the chamber can include a highly reflective coating or the like to enhance observation of the" changes to composition 40. The arrangement of the first, second, and third layers of the conductive layer 14a is shown in the enlarged, sectional view of FIG. 16.

Other constructions of the battery strength indicators and switches are contemplated within the scope of this invention. For example, an indicator can be fabricated with conductive top and base layers which sandwich a nonconductive layer. A cell is formed between the top and bottom layers as described herein. The nonconductive layer does not extend into the cell; this layer, however, does electrically insulate the top layer from the bottom layer. The cell is filled with an indicator material as described herein and the top and bottom layer are independently adopted to be connected to different poles of a battery. The top and/or bottom layer are transparent or translucent.

Another indicator embodiment contemplated by the present invention is similar to indicator 10D of FIG. 10. This alternative embodiment has top and base layers sandwiching a conductive layer that is reduced to a small cross-sectional area in a indicator region of the indicator. The top layer and/or base layer undergo color changes when the temperature crosses a predetermined threshold. The conductive layer in the indicator region is adopted to exceed the predetermined temperature threshold when the voltage potential across the conductive layer exceeds a predetermined voltage.

In another embodiment of the indicator, the indicator can use a BIOMETAL material of TOKI AMERICAN TECHNOLOGIES, INC. of Irvine, Calif. BIOMETAL material is a shape memory alloy which changes its internal structure at a predetermined temperature and takes on an entirely new space. A BIOMETAL material can be used in place of the pyrotechnic material or color indicating material of the device 10D of FIG. 10 to indicate whether the battery has a predetermined voltage.

The present intention can be used with a dry cell battery or with a wet-cell battery and with both rechargeable and nonrechargeable batteries. However, for purposes of convenience, the invention has been described herein with respect to a dry-cell battery.

The modern nonrechargeable alkaline dry-cell battery has a declining output voltage over its useful life. A new battery has an output voltage of about 1.60 volts. After one hour of continuous use, a battery's voltage output (no-load) drop to between 1.40 volts and 1.45 volts. Thereafter, for the majority of the battery's useful life, the battery's no-load voltage gradually decreases in a somewhat linear fashion. As a battery approaches the end of its useful life, the no-load voltage drops to about 1.0 volt. However, the battery still has some capacity and can be marginally used in this weakened condition for very brief periods of time. When the battery's voltage drops below 1.0 volt, the battery is near the end of its life, and the remaining capacity of the battery is very limited. Near the point of exhaustion, the battery's output voltage rapidly drops from about 1.0 volt to about 0.5 or 0.6 volt.

The light-output candle-power of a portable lantern or flashlight bulb is somewhat sensitive to the battery voltage. Incandescent lamps are designed to operate optimally at a specific voltage. If the voltage is appreciably exceeded (such as by 50%) for any period of time, the film of the lamp will rapidly melt or vaporize, destroying the lamp. Most lamps are designed for voltages in increments of 1.2 volts. Thus, portable-lantern incandescent lamps are designed optimally for an output voltage of about 4.8 volts (a 6-volt lantern), and single-cell, double-cell, triple-cell, four-cell, and five-cell flashlight incandescent lamp are designed for an output voltage of 1.2, 2.4, 3.6, 4.8, and 6.0 volts respectively. However, flashlight and lantern bulbs will operate effectively over a broad range. For example, a two-cell lantern bulb or lamp will operate effectively from about 3.2 volts to about 2.0 volts. However, when the voltage of each battery drops below 1.0 volt, the output of the incandescent lamp is noticeably affected, and the color of the emitted light shifts from a yellow-white light to a yellow-red light.

Three sets of batteries were tested in three identical flashlights, with the batteries being switched between the flashlights on a routine basis. The results of the tests are shown in the following tables. (The Roman numerals I, II, and III indicate the flashlight, and the numbers, 1A, 1B, 2A, 2B, 3A and 3B indicate the individual batteries.) The first set of batteries (1A and 1B) were ENERGIZER brand alkaline batteries; the second set (2A and 2B) were DURACELL brand alkaline batteries, and the third set (3A and 3B) were EVEREADY brand zinc-carbon batteries. The batteries were "D" size batteries. Battery 2A failed after 32 hours and was replaced with a 3-year old DURACELL alkaline battery having a no-load voltage of 0.99 volt.

The flashlights were two-cell flashlights having incandescent lamps. The incandescent lamps were rated at 1.2 volts and 0.5 amp. The cold-filament internal resistance of the incandescent lamps was about 0.4 amp. The hot-filament internal resistance of the incandescent lamps was not measured.

Each flashlight was loaded with a set of batteries and turned on. From time to time, the flashlights were turned off and the no-load output voltage of the batteries was measured. On a periodic basis, the output voltage of the batteries under load was also measured. The tests were not run on a continuous, 24-hour basis, but were run for periods of approximately 12 hours during the first two days, about 3 hours the third day, about 7 hours during the fourth day, about 6 hours the ninth day, and 20 minutes the tenth day. No tests were conducted during the fifth, sixth, seventh and eighth days. The results show that the useful life of a battery is near exhaustion when the voltage of the battery has fallen below 1.0 volt. After the voltage of the battery drops below 1.0, the discharge rate of the battery (indicated by the voltage drop) can exceed 0.5 volt in a half-hour.

It appears, from the tables, that the useful life of the 1A and 1B batteries is about 28 to 29 hours and the half-life is about 14 hours where the output voltage is about 1.2 volts. When the output voltage of the batteries is about 1.3 volts, the batteries have about 75% of their operating life remaining. When the voltage of the batteries is about 1.1 volts, the batteries have about 25% of their useful life remaining.

The 2A and 2B batteries appear to have a useful life of about 23 hours and a half-life of about 12 hours where the output voltage is about 1.2. When the output voltage of the batteries is about 1.3 volts, the batteries have about 75% of their useful life remaining. When the output voltage drops to about 1.15 volts, the batteries have only about 25% of their remaining useful life.

Batteries 3A and 3B, which are zinc-carbon batteries (LeChanche cell), had a much shorter life span than the alkaline batteries. These batteries had a useful life of about 7.5 hours, with a half-life of about 3.5 to about 4 hours where the output voltage is abut 1.2 volts. When the batteries' output voltage is about 1.3 volts, the batteries have about 75% of their remaining useful life. When the batteries' output voltage drops to about 1.1 volts, the batteries only have about 25% of their useful life remaining.

When the no-load output voltage of the batteries dropped below 1.0 volt, all the batteries exhibited rapid voltage drops. When the batteries reached the end of their useful life, the flashlights were turned off and the batteries were allowed to rest. Surprisingly, the batteries' output voltage would rebound and the batteries could be operated for brief periods. As this cycle of rest and use was continued, the batteries' ability to rebound decreased and the batteries experienced much more rapid voltage drops under the load.

The tests indicate that, when the batteries are fresh, the total voltage drop of a pair of batteries in series is somewhere from about 0.45 to about 0.65 volt; that is, the total output voltage of the two batteries in the flashlight under no-load will be about 3 volts, and under the load will be about 2.5 volts. As the batteries approached their half-life, the voltage drops for the two batteries increased to about 0.75-about 0.95 volt. When the batteries approached the end of their useful life, the voltage drop was in excess of 1.0 volt; that is, the output voltage of the two batteries under no-load was from about 2.0 to about 2.2, and the voltage drop was from about 1.0 volt to about 1.7 volts.

The tests also show that, when batteries have reached their exhaustion point but are allowed to rest for a few hours, their no-load output voltage will exceed 1.0 volt. However, when the batteries are then put under a load, the working voltage of the batteries rapidly drops to as low as 0.6 volt. This voltage drop can be observed because the output voltage of the batteries in the weakened condition does not drop in a single-step manner but continues to drop over time, sometimes taking as long as 30 seconds to stabilize. For example, two used DURACELL brand alkaline batteries, each having a no load output voltage of about 0.95 volt, were placed (i.e., used) in a flashlight for one hour. At the end of one hour, the no-load output voltage of the batteries was about 0.45 and 0.5 volt, respectively. The batteries were put under a load, and the voltage immediately dropped between 0.6 and 0.7 volt, for both batteries in series, and then continued to drop, over a 30 second period, for a final value, for both batteries in a series, of 0.48 volt. This same type of phenomenon was observed with the ENERGIZER alkaline batteries and with the EVERREADY brand zinc-carbon batteries. Thus, the device equipped with exhausted batteries may give a strong operation for a short period of time, but then will quickly decrease in power under the on-going load.

TABLE I

BATTERY OUTPUT VOLTAGE IN OPERATION
(Incandescent Flashlight Bulb)

| Time | Battery Voltage | | | | | |
|---|---|---|---|---|---|---|
| (Hours) | 1A | 1B | 2A | 2B | 3A | 3B |
| 0.00 | 1.60 | 1.60 | 1.59 | 1.60 | 1.60 | 1.60 |
| 1.00 | 1.45 | 1.45 | 1.45 | 1.45 | 1.35 | 1.35 |
| 1.50 | 1.40 | 1.45 | 1.40 | 1.40 | 1.30 | 1.30 |
| 2.00 | 1.40 | 1.40 | 1.35 | 1.35 | 1.30 | 1.30 |
| 2.50 | 1.39 | 1.39 | 1.35 | 1.35 | 1.30 | 1.30 |
| 3.50 | 1.39 | 1.39 | 1.32 | 1.32 | 1.20 | 1.20 |
| 4.50 | 1.39 | 1.39 | 1.30 | 1.30 | 1.20 | 1.19 |
| 5.50 | 1.30 | 1.30 | 1.30 | 1.30 | 1.10 | 1.10 |
| 6.50 | 1.30 | 1.30 | 1.30 | 1.30 | 1.05 | 1.02 |
| 7.50 | 1.30 | 1.30 | 1.29 | 1.29 | 1.01 | 1.01 |
| 10.00 | 1.29 | 1.29 | 1.28 | 1.25 | 0.89 | 0.75 |
| 11.00 | 1.28 | 1.28 | 1.25 | 1.25 | 0.80* | 0.55* |

TABLE I-continued

BATTERY OUTPUT VOLTAGE IN OPERATION
(Incandescent Flashlight Bulb)

| Time | Battery Voltage | | | | | |
|---|---|---|---|---|---|---|
| (Hours) | 1A | 1B | 2A | 2B | 3A | 3B |
| 12.00 | 1.25 | 1.25 | 1.20 | 1.20 | 0.75* | 0.60* |
| 12.50 | 1.20 | 1.20 | 1.20 | 1.20 | 0.78* | 0.60* |
| TEST DISCONTINUED FOR 10.25 HOURS | | | | | | |
| 12.50 | 1.35 | 1.35 | 1.36 | 1.36 | 1.25 | 1.20 |
| 12.75 | 1.30 | 1.30 | 1.30 | 1.30 | 1.05 | 0.90 |
| 13.00 | 1.29 | 1.29 | 1.28 | 1.26 | 0.95 | 0.75 |
| 13.25 | 1.27 | 1.25 | 1.25 | — | 0.80 | 0.51 |
| 13.50 | 1.26 | 1.25 | 1.25 | 1.25 | 0.89 | 0.70 |
| 14.10 | 1.22 | 1.22 | 1.21 | 1.20 | 0.71 | 0.55 |
| 15.25 | 1.21 | 1.21 | 1.20 | 1.20 | 0.91 | 0.80 |
| 16.25 | 1.21 | 1.20 | 1.18 | 1.18 | 0.61 | 0.40 |
| 17.25 | 1.20 | 1.20 | 1.18 | 1.16 | 0.60 | 0.00 |
| 18.50 | 1.20 | 1.19 | 1.15 | 1.15 | DISCONTINUED | |
| 19.50 | 1.19 | 1.16 | 1.10 | 1.10 | DISCONTINUED | |
| 20.50 | 1.13 | 1.11 | 1.10 | 1.10 | 0.99 | 0.81 |
| 22.25 | 1.10 | 1.10 | 1.04 | 1.05 | 0.49 | 0.00 |
| 23.25 | 1.05 | 1.05 | 1.01 | 1.01 | 0.55 | 0.00 |
| 24.50 | 1.05 | 1.05 | 0.89 | 0.93 | 0.80 | 0.00 |
| 25.75 | 1.02 | 1.02 | 0.49 | 0.90 | DISCONTINUED | |
| TEST DISCONTINUED FOR 9 HOURS | | | | | | |
| 25.75 | 1.19 | 1.20 | 1.20 | 1.20 | — | — |
| 26.75 | 1.01 | 1.01 | 0.99 | 0.99 | — | — |
| 27.90 | 1.00 | 1.00 | 0.95 | 0.95 | — | — |
| 28.50 | 0.99 | 0.99 | 0.85 | 0.86 | — | — |
| TEST DISCONTINUED FOR 21.5 HOURS | | | | | | |
| 28.50 | 1.11 | 1.12 | 1.12 | 1.11 | — | — |
| 29.50 | 0.99 | 0.99 | 0.90 | 0.89 | — | — |
| 32.25 | 0.94 | 0.95 | 0.39 | 0.95 | — | — |
| TEST DISCONTINUED FOR 2 HOURS | | | | | | |
| 32.25 | 0.98 | 0.98 | 0.99* | 0.90 | — | — |
| 34.40 | 0.81 | 0.91 | 0.91* | 0.80 | — | — |
| 35.75 | {.65 | {.65 | {.65* | {.65 | — | — |
| TEST DISCONTINUED FOR 112.5 HOURS | | | | | | |
| 35.75 | 1.09 | 1.09 | 1.12* | 1.10 | — | — |
| 40.35 | {.65 | {.65 | {.65* | {.65 | — | — |
| TEST DISCONTINUED FOR 3.25 HOURS | | | | | | |
| 40.35 | 0.98 | 0.99 | 0.95* | 0.98 | — | — |
| 41.35 | 0.60 | 0.52 | 0.45* | 0.54 | — | — |
| TEST DISCONTINUED FOR 13.75 HOURS | | | | | | |
| 41.35 | 1.01 | 1.01 | 0.99* | 0.97 | — | — |
| 41.70 | 0.71 | 0.79 | 0.50* | 0.70 | — | — |
| TEST DISCONTINUED FOR 2 MINUTES | | | | | | |
| 41.70 | 0.90 | 0.91 | 0.80* | 0.81 | — | — |

*Replacement for Battery 2A

Table II sets forth the measured battery voltage drop of batteries 1A, 1B, 2A, and 2B under load. The tests were commenced when the batteries passed their operational half-life. As can be seen, the voltage drop of a battery under load increased as the battery approached the end of its useful life. More indicative than the actual drop, is the amount of time it takes to stablize the voltage under load. During the useful life of the battery, a voltage drop from the no-load voltage to the load voltage of the battery is an immediate single-step voltage drop. When the batteries are beyond their useful life, the voltage drop is a continuous, slow drop that can take some time stablize, sometimes exceeding 30 seconds. This is indicative that the batteries are exhausting their limited capacities.

TABLE II

BATTERY VOLTAGE DROP UNDER LOAD
(Incandescent Flashlight Bulbs)

| Test Time (Hrs) | BATTERIES 1A & 1B | | | BATTERIES 2A & 2B | | |
|---|---|---|---|---|---|---|
| | No Load Voltage | Voltage Under Load | Voltage Drop | No Load Voltage | Voltage Under Load | Voltage Drop |
| 16.25 | 2.39 | 1.96 | 0.43 | 2.30 | 1.88 | 0.47 |
| 18.50 | 2.35 | 1.89 | 0.46 | 2.28 | 1.89 | 0.30 |
| 20.50 | 2.30 | 1.85 | 0.45 | 2.20 | 1.80 | 0.40 |
| 22.25 | 2.23 | 1.80 | 0.43 | 2.10 | 1.71 | 0.39 |
| 23.25 | 2.15 | 1.61 | 0.54 | 2.05 | 1.51 | 0.54 |
| 24.50 | 2.11 | 1.60 | 0.51 | 1.90 | 1.49 | 0.41 |
| 25.75 | — | — | — | 1.94 | 1.46 | 0.48 |
| TEST DISCONTINUED FOR 9 HOURS | | | | | | |
| 25.75 | 2.32 | 1.70 | 0.62 | 2.35 | 1.75 | 0.60 |
| 26.75 | 2.08 | 1.40 | 0.68 | 2.01 | 1.52 | 0.49 |
| 27.90 | 2.02 | 1.40 | 0.62 | 1.82 | 1.30 | 0.52 |
| TEST DISCONTINUED FOR 21.5 HOURS | | | | | | |
| 29.50 | 1.99 | 1.29 | 0.70 | 1.81 | 1.20 | 0.61 |
| 32.25 | 1.92 | 1.35 | 0.57 | 0.49* | 0.10* | 1.39* |
| TEST DISCONTINUED FOR 112.5 HOURS | | | | | | |
| 35.75 | 2.18 | 1.31 | 0.87 | 2.21* | 1.10* | 1.11* |
| TEST DISCONTINUED FOR 3.25 HOURS | | | | | | |
| 41.35 | 1.80 | 0.91 | 0.89 | 1.00* | 0.48* | 0.52* |

*Replacement for Battery 2A

While the invention has been described with reference to specific embodiments, it will be recognized by those skilled in the art that variations are possible without departing from the spirit and scope of the invention, and that it is intended to cover all changes and modifications of the invention disclosed herein for the purposes of illustration which do not constitute departure from the spirit and scope of the invention.

What is claimed is:

1. A battery package having a battery-strength indicator comprising:
    a package frame;
    rechargeable batteries mounted on said package frame, each of said batteries having first and second terminals;
    a battery-strength indicator mounted on said package frame and electrically connected to a first terminal of one of said batteries; and
    a battery switch comprising a resilient, nonconductive layer disposed over said package frame, a switch chamber disposed beneath said resilient layer, a first conductor extending from said switch chamber and connected to said indicator, and a second conductor extending from said switch chamber and connected to a second terminal of one of said batteries, said battery switch being biased in an electrically open position,
    whereby upon pressing of the resilient layer over said switch chamber, the switch contacts will place said indicator in electrical contact across the terminals of said batteries.

2. The battery package of claim 1 wherein said batteries are connected to said battery-strength indicator and said battery switch in parallel.

3. The battery package of claim 1 wherein said batteries are connected to said battery-strength indicator and said battery switch in series.

4. The battery package of claim 1 wherein said indicator comprises a LED array.

5. The battery package of claim 4 wherein said batteries are dry cell batteries connected to said battery-strength indicator and said battery switch in parallel.

6. The battery package of claim 4 wherein said batteries are dry cell batteries connected to said battery-strength indicator and said battery switch in series.

* * * * *